US010872280B2

(12) United States Patent
Jung et al.

(10) Patent No.: US 10,872,280 B2
(45) Date of Patent: Dec. 22, 2020

(54) GROUPING OBJECTS OF A COMPOUND DOCUMENT AND COMPRESSING THE GROUP USING A COMPRESSION METHOD CORRESPONDING TO THE GROUP

(71) Applicant: Hewlett-Packard Development Company, L.P., Spring, TX (US)

(72) Inventors: Joo Young Jung, Suwon-si (KR); Yu Na Oh, Suwon-si (KR); So Hye Kim, Suwon-si (KR); Jin Myung Joo, Suwon-si (KR); Changlak Lee, Suwon-si (KR); Sung Won Chae, Suwon-si (KR)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/339,952

(22) PCT Filed: Dec. 12, 2017

(86) PCT No.: PCT/KR2017/014519
§ 371 (c)(1),
(2) Date: Apr. 5, 2019

(87) PCT Pub. No.: WO2018/110931
PCT Pub. Date: Jun. 21, 2018

(65) Prior Publication Data
US 2020/0042843 A1   Feb. 6, 2020

(30) Foreign Application Priority Data

Dec. 12, 2016  (KR) .................. 10-2016-0168710

(51) Int. Cl.
*G06F 3/12* (2006.01)
*G06K 15/00* (2006.01)
*G06K 15/02* (2006.01)

(52) U.S. Cl.
CPC ....... *G06K 15/1865* (2013.01); *G06F 3/1297* (2013.01); *G06K 15/184* (2013.01)

(58) Field of Classification Search
CPC ............ G06K 15/1865; G06K 15/184; G06K 15/1842; G06K 15/1843; G06K 15/1853; G06K 15/1855; G06F 3/1297
See application file for complete search history.

(56) References Cited

U.S. PATENT DOCUMENTS 5,949,968 A * 9/1999 Gentile .............. G06K 15/1865
358/1.16
5,991,515 A * 11/1999 Fall .................... G06K 15/1865
358/1.12

(Continued)

FOREIGN PATENT DOCUMENTS

KR    10-2013-0054899    5/2013

*Primary Examiner* — Juan M Guillermety
(74) *Attorney, Agent, or Firm* — Jefferson IP Law, LLP

(57) ABSTRACT

A method of encoding print data performed by a host device is described in which a print request for a compound document is received; objects included in the compound document is classified into predetermined groups based on object attribute information; each of the predetermined groups is compressed according to a preset compression method; and the compressed groups is merged and the merged groups is transmitted to an image forming apparatus.

16 Claims, 8 Drawing Sheets

(56) References Cited

U.S. PATENT DOCUMENTS

| | | | |
|---|---|---|---|
| 7,200,263 B2 * | 4/2007 | Curry | H04N 1/407 |
| | | | 345/601 |
| 7,751,633 B1 | 7/2010 | Mukherjee | |
| 8,855,414 B1 | 10/2014 | Hobbs et al. | |
| 2002/0168105 A1 | 11/2002 | Li | |
| 2004/0172495 A1 * | 9/2004 | Gut | G06F 12/0875 |
| | | | 711/1 |
| 2007/0070375 A1 * | 3/2007 | Owen | G06F 3/1285 |
| | | | 358/1.13 |
| 2009/0141048 A1 | 6/2009 | Fujimoto et al. | |
| 2012/0039534 A1 | 2/2012 | Malik et al. | |
| 2016/0077779 A1 * | 3/2016 | Kim | G06F 3/1206 |
| | | | 358/1.9 |
| 2017/0243093 A1 * | 8/2017 | Jung | G06K 15/1855 |

* cited by examiner

[Fig. 1]
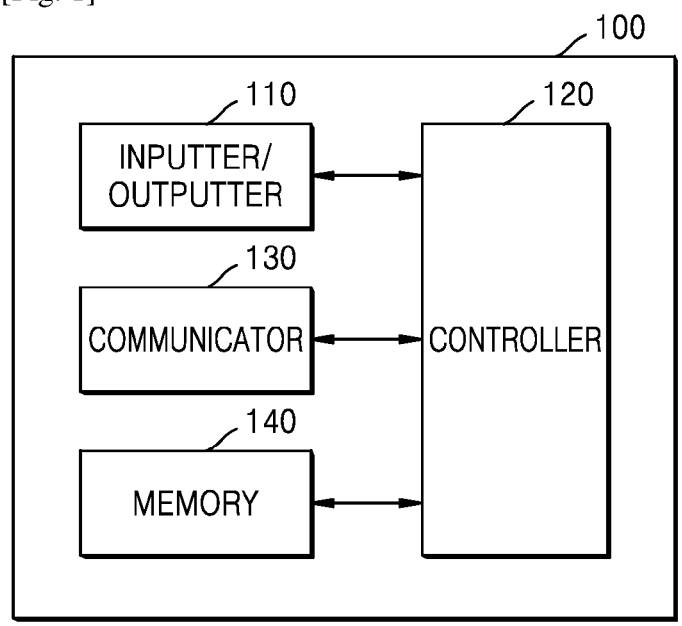

[Fig. 2]
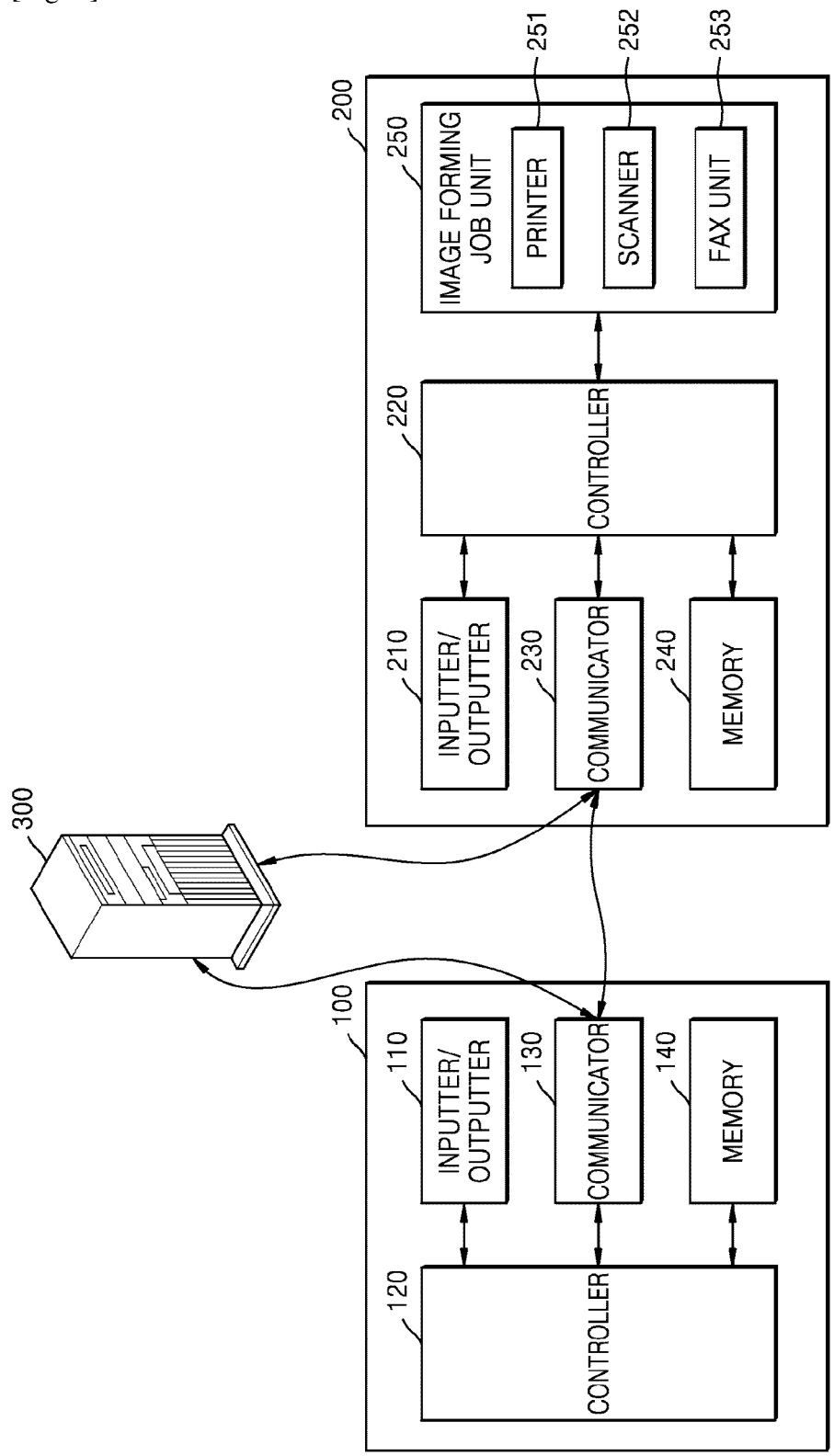

[Fig. 3]
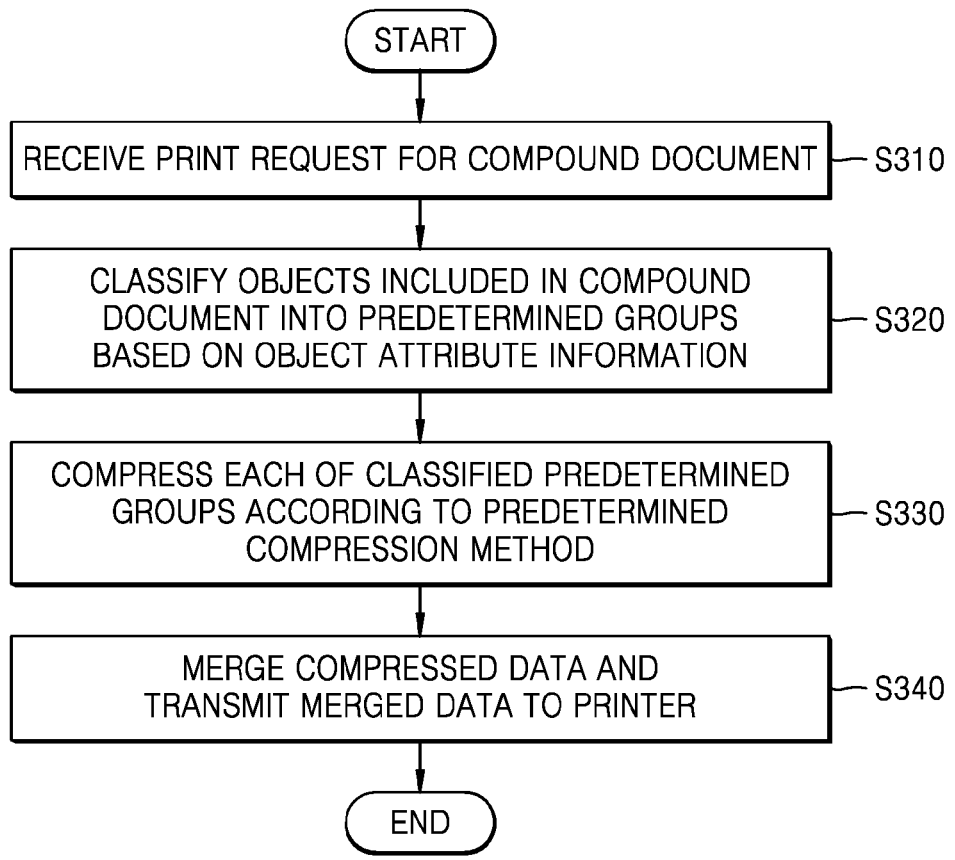

[Fig. 4]
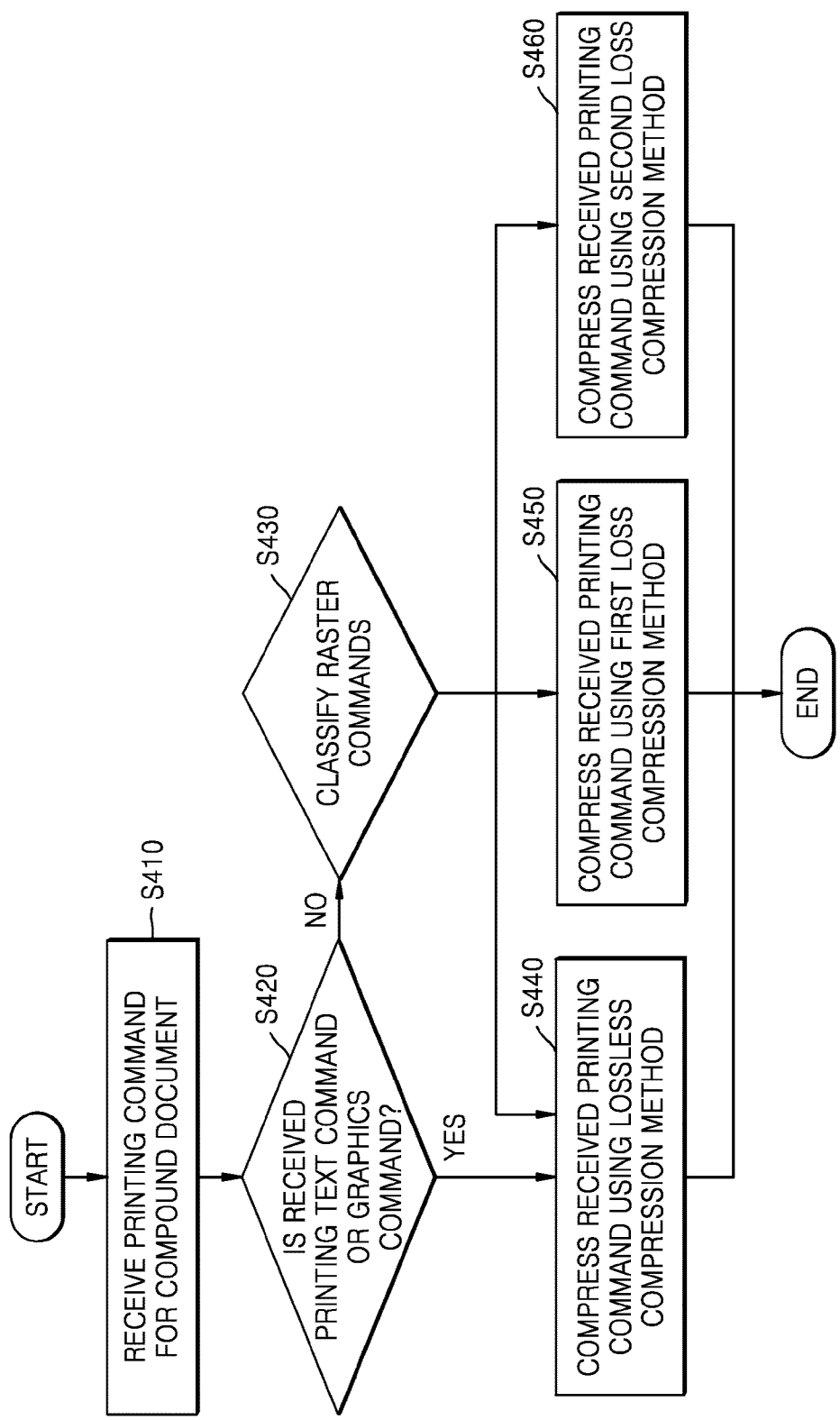

[Fig. 5]
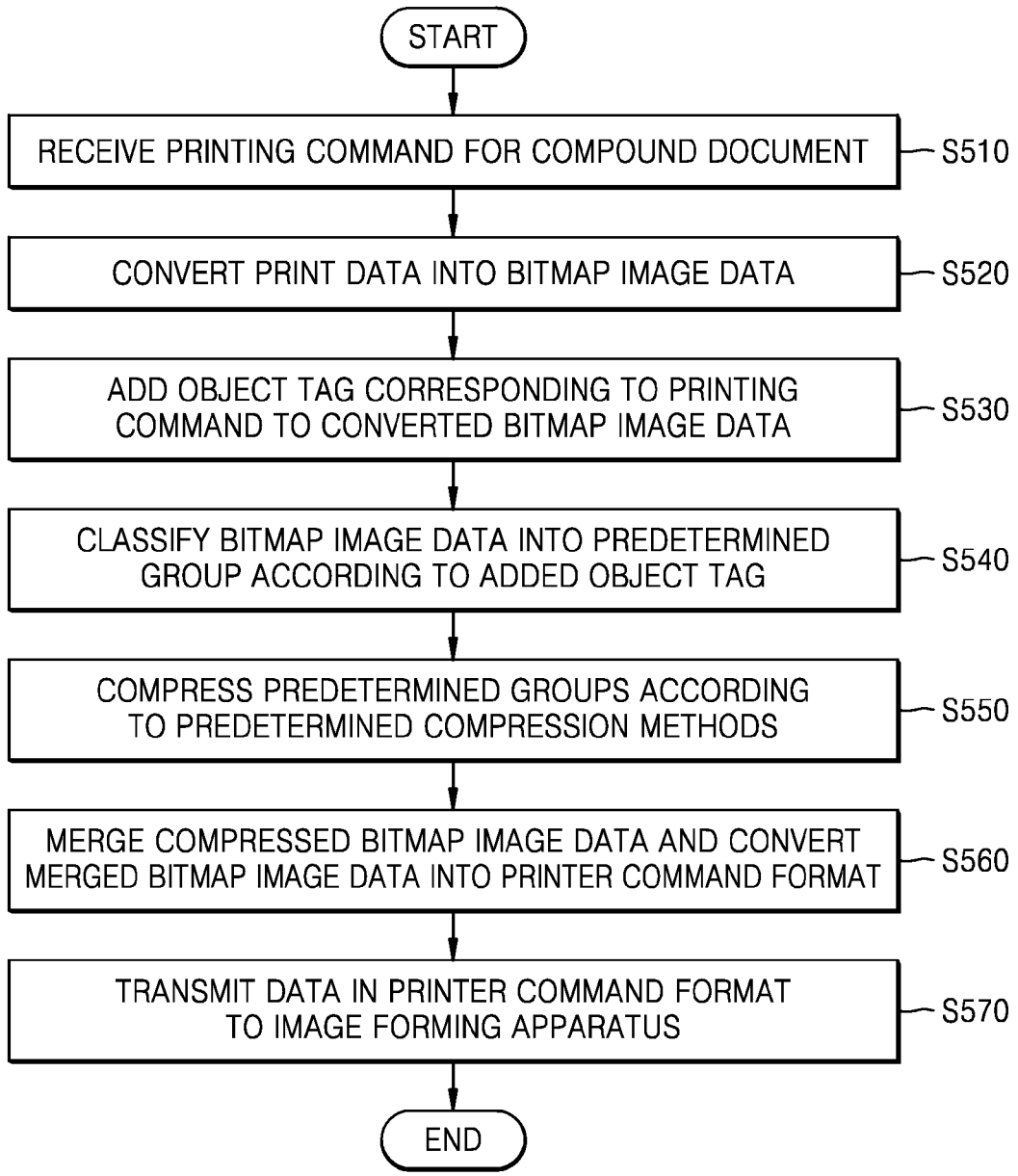

[Fig. 6]
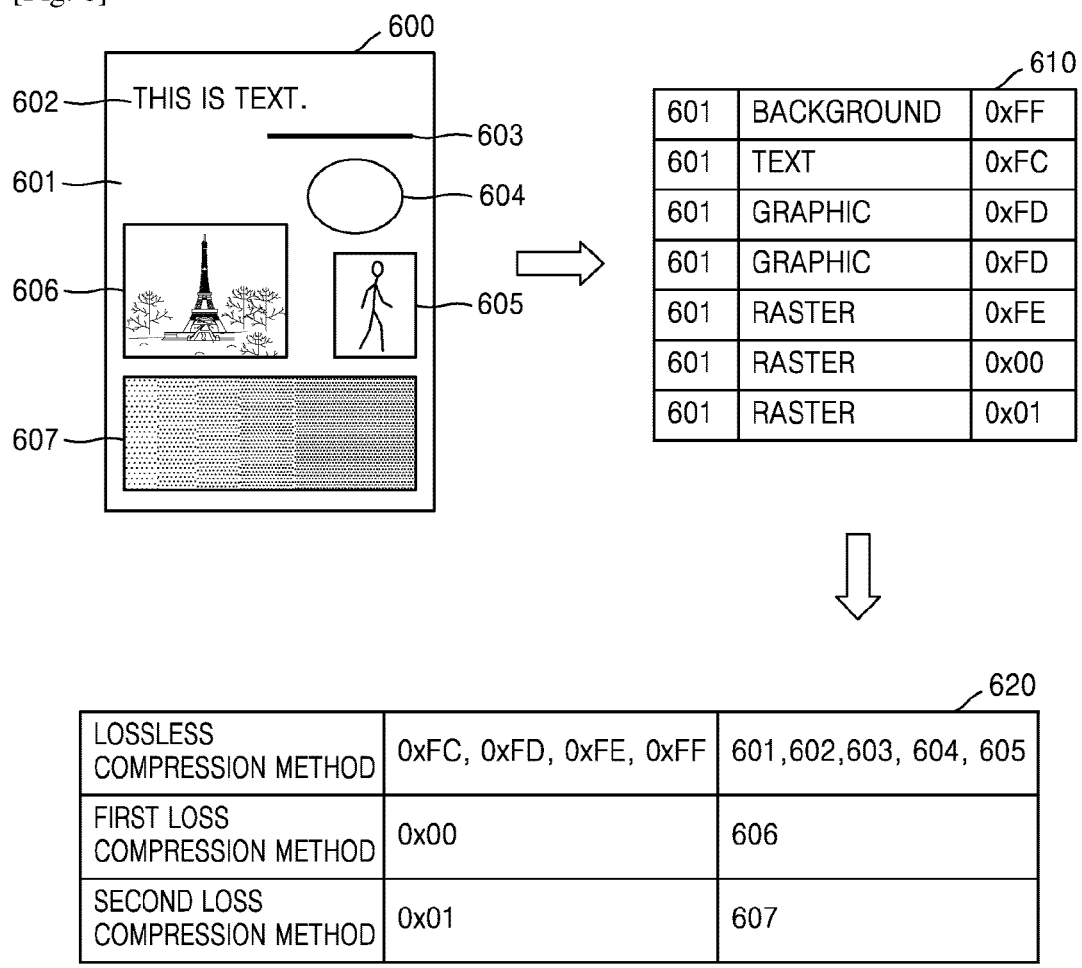

[Fig. 7]
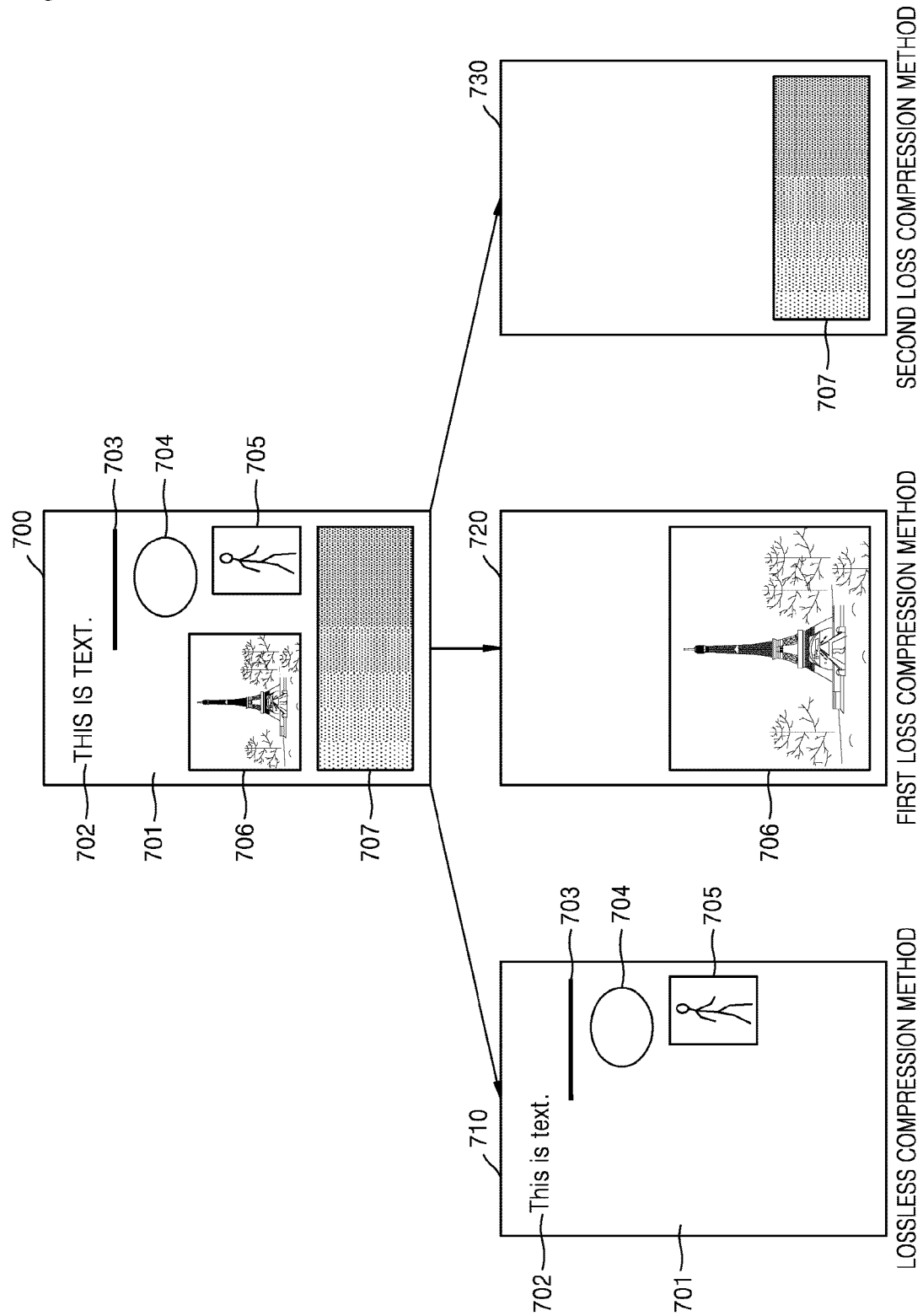

[Fig. 8]
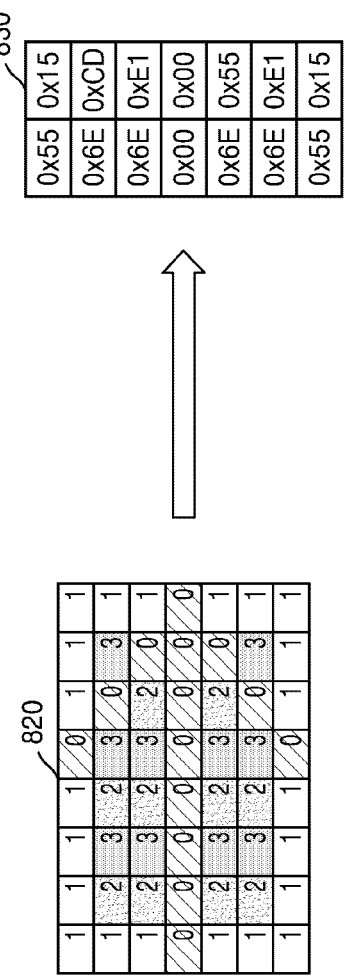
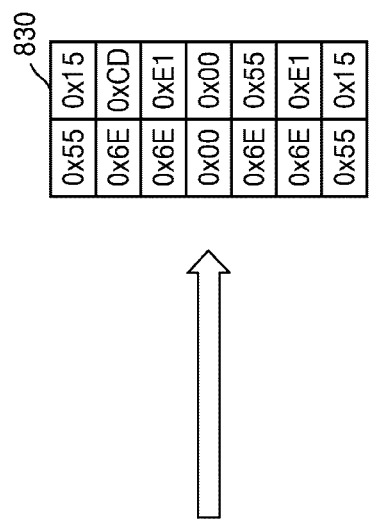
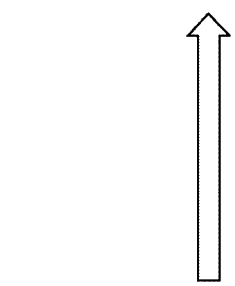
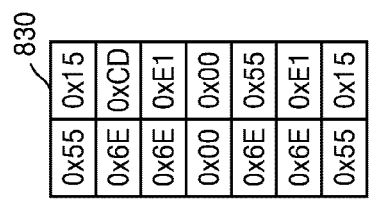

GROUPING OBJECTS OF A COMPOUND DOCUMENT AND COMPRESSING THE GROUP USING A COMPRESSION METHOD CORRESPONDING TO THE GROUP

BACKGROUND ART

A printer receives print data from a host device such as a PC or mobile terminal and prints a document. In order to reduce print data processing load of the printer, a host-based printing method is used as a method in which the host device converts the print data into bitmap image data.

DISCLOSURE OF INVENTION

Brief Description of Drawings

These and/or other aspects will become apparent and more readily appreciated from the following description of the examples, taken in conjunction with the accompanying drawings in which:

FIG. 1 is a diagram illustrating a host device according to an example of the present disclosure;

FIG. 2 is a diagram illustrating a host device and an image forming apparatus for performing print data encoding and decoding methods, according to an example of the present disclosure;

FIG. 3 is a flowchart of a method by which a host device encodes print data, according to an example of the present disclosure;

FIG. 4 is a flowchart of a method by which a host device encodes a printing command, according to an example of the present disclosure;

FIG. 5 is a flowchart of a method by which a host device classifies raster commands according to an object tag, according to an example of the present disclosure;

FIG. 6 illustrates an example in which a host device classifies raster commands according to an object tag according to an example of the present disclosure;

FIG. 7 illustrates an example in which a host device classifies raster objects based on object attribute information according to an example of the present disclosure; and FIG. 8 is a diagram illustrating an example in which a host device converts bitmap image data into index color data according to an example of the present disclosure.

MODE FOR THE INVENTION

Hereinafter, examples of the present disclosure will be described in detail with reference to the accompanying drawings so that those skilled in the art may easily carry out the present disclosure. However, the present disclosure may be embodied in many different forms and is not limited to the examples described herein. In order to clearly illustrate the present disclosure in the drawings, portions that are not related to the description are omitted, and like reference numerals are given to similar portions throughout the specification.

Throughout the specification, when a part is referred to as being "connected" to another part, it includes not only "directly connected" but also "electrically connected" with another part therebetween. Also, when an element is referred to as "including" an element, it does not exclude other elements unless specifically stated to the contrary.

The term "image forming job" as used herein may mean various jobs (e.g., print, scan, or fax) related to an image such as forming of the image or generating/storing/transmitting of an image file. The term "job" may mean not only an image forming job but also all of a series of processes necessary for performing the image forming job.

The term "image forming apparatus" may mean any apparatus capable of performing an image forming job such as a printer, a scanner, a fax machine, a multi-function printer (MFP), a display apparatus, etc.

Also, the term "host device" may mean any device capable of transmitting content to an image forming apparatus such as a PC, a tablet PC, a mobile phone, a smart phone, a personal digital assistant (PDA), and a PMP.

Also, the term "print data" may mean data converted into a printable format in a printer.

Also, the term "scan file" may mean a file generated by scanning an image with a scanner.

Also, the term "user" may mean a person who performs an operation related to an image forming job using an image forming apparatus or a device connected with the image forming apparatus by wire or wirelessly.

In the present specification, before a host device transmitting print data to a printer and a method of transmitting the print data by the host device are described in detail, a "compound document" and a "printing command" generated therefrom will be described.

The term "compound document" may be defined as a document containing a plurality of types of objects. An object or a print object represents each printable object such as a photograph, a letter, and a figure forming the print data. Hereinafter, a compound document including a text object, a graphic object, and a raster object will be described as an example.

For example, the text object may be composed of letters, numbers, symbols, and the like. Also, the graphic object may be composed of lines, figures, tables, and charts, and the raster object may be composed of photographs, pictures, and the like.

The "printing command" generated from the compound document may include a command corresponding to each of a plurality of types of objects included in the compound document. For example, if the compound document includes a text object, a graphics object, and an image object, the printing command may include a text command, a graphics command, and a raster command.

Upon reception of a print request for the compound document, for example, for printing at least one object included in the compound document, an application of the host device may generate a printing command using a standard function of the OS and transmit the printing command to a printer driver of the host device. The printer driver of the host device may encode the received printing command in a printer control language (PCL) and transmit the encoded printing command to the printer.

Hereinafter, examples in which a host device encodes a printing command and transmits the encoded printing command to a printer will be described.

FIG. 1 is a diagram illustrating a host device 100 according to an example of the present disclosure.

Referring to FIG. 1, the host device 100 for performing a method of encoding print data according to an example may include an inputter/outputter 110, a controller 120, a communicator 130, and a memory 140.

The inputter/outputter 110 may include an inputter for receiving an input from a user and an outputter for displaying a processing result with respect to the received input.

For example, the inputter/outputter 110 may include apparatuses capable of receiving various types of user input such as a keyboard, a mouse, a physical button, a touch screen, a camera or a microphone. Further, the outputter may include, for example, a display panel or a speaker. However, the present disclosure is not limited thereto, and the inputter/outputter 110 may include an apparatus supporting various inputs/outputs.

The controller 120 may control operations of the host device 100 and may include at least one processor such as a CPU or the like. The controller 120 may control other components of the host device 100 to perform an operation corresponding to the user input received through the inputter/outputter 110.

For example, the controller 120 may access the memory 140, read data, and perform an operation according to a control command received from the inputter/outputter 110 as a configuration for performing an operation process.

Also, the controller 120 may execute a program stored in the memory 140, read a file stored in the memory 140, or store a new file in the memory 140.

In an example, the controller 120 may receive a print request for a compound document from a user via the inputter/outputter 110. Also, the controller 120 may receive a printing command for the compound document.

Also, the controller 120 may classify objects included in the compound document into predetermined groups based on object attribute information. Also, the controller 120 may classify printing commands into predetermined groups based on the object attribute information, for example, the object attribute information corresponding to the printing commands.

Further, the controller 120 may classify raster commands, among the printing commands, corresponding to raster objects into predetermined groups based on object attribute information, the object attribute information corresponding to or of the raster objects among the printing commands. For example, the controller 120 may classify the raster commands according to the number of colors used in the raster objects, gradient values of the raster objects, an enlargement print ratio of the raster objects, or an area ratio between the raster objects and background objects included in the print data.

Also, the controller 120 may compress each of the predetermined groups according to a predetermined compression method. The controller 120 may compress at least one of the predetermined groups according to a loss compression scheme without performing YCC conversion.

Also, the controller 120 may convert bitmap image data included in at least one of the predetermined groups into index color data based on the number of colors used and compress the index color data.

Also, the controller 120 may merge the compressed groups and transmit the merged groups to an image forming apparatus 200.

The communicator 130 allows the host device 100 to communicate with another external device 300 or the Internet. In particular, the host device 100 may communicate with the image forming apparatus via the communicator 130 by wire/wirelessly.

To this end, the communicator 130 may include a communication module supporting at least one of various wire/wirelessly communication methods. For example, the communication module may be in the form of a chipset, or may be a sticker/barcode (e.g., a sticker containing an NFC tag) or the like that contains information for communication.

Wireless communication may include at least one of, for example, wireless Fidelity (Wi-Fi), Wi-Fi direct, Bluetooth, ultra wide band (UWB), or near field communication (NFC).

Wired communication may include at least one of, for example, USB or high definition multimedia interface (HDMI).

The memory 140 is a space in which data such as programs for the controller 120 to perform calculations is stored. The controller 120 may access the memory 140 and perform calculations using data stored in the program. The controller 120 may temporarily store data for performing a specific operation in the memory 140 and use the data.

Also, an OS, an application, and a printer driver may be installed in the memory 140. An application may correspond to a program that supports generation and editing of a document. The printer driver may correspond to a program provided by an image forming apparatus manufacturer for converting a printing command into a PCL.

A specific method by which the controller 120 encodes print data will be described in detail below with reference to the drawings.

FIG. 2 is a diagram illustrating the host device 100 and the image forming apparatus 200 for performing print data encoding and decoding methods, according to an example of the present disclosure.

Referring to FIG. 2, as shown in FIG. 1, the host device 100 may include the inputter/outputter 110, the controller 120, the communicator 130, and the memory 140. Descriptions of the inputter/outputter 110, the controller 120, the communicator 130, and the memory 140 of the host device 100 are the same as those provided above with reference to FIG. 1 and thus not given with reference to FIG. 2 for convenience of description.

The image forming apparatus 200 for performing a method of decoding print data received from the host device 100 may include an inputter/outputter 210, a controller 220, a communicator 230, a memory 240, and an image forming job unit 250. Further, although not shown, the image forming apparatus 200 may further include a power supply for supplying power to the respective components.

The inputter/outputter 210 may include an inputter for receiving an input or the like for performing an image forming job from a user, and an outputter for displaying information about a result of performing the image forming job or a state of the image forming apparatus 200. For example, the inputter/outputter 210 may include an operation panel for receiving a user input and a display panel for displaying a screen, and the like.

Specifically, the inputter may include apparatuses capable of receiving various types of user input, such as, a keyboard, a physical button, a touch screen, a camera or a microphone. Further, the outputter may include, for example, a display panel or a speaker. However, the present disclosure is not limited thereto, and the inputter/outputter 210 may include apparatuses supporting various inputs/outputs.

The controller 220 may control operations of the image forming apparatus 200 and may include a processor such as a CPU or the like. The controller 220 may control other components of the image forming apparatus 200 to perform an operation corresponding to the user input received through the inputter/outputter 210.

In an example, the controller 220 may de-merge data received from the host device 100.

Also, the controller 220 may decompress the data received from the host device 100. The controller 220 may decompress predetermined compressed data groups received from the host device 100 using different respective decompression methods.

The communicator 230 may perform wire/wirelessly communication with another device or a network. To this end, the communicator 230 may include a communication module supporting at least one of various wire/wirelessly communication methods. For example, the communication module may be in the form of a chipset, or may be a sticker/barcode (e.g., a sticker containing an NFC tag) or the like that contains information for communication.

Wireless communication may include at least one of, for example, wireless Fidelity (Wi-Fi), Wi-Fi direct, Bluetooth, ultra wide band (UWB), or near field communication (NFC). Wired communication may include at least one of, for example, USB or HDMI.

The communicator 230 may transmit signals or data received from the host device 100 to the controller 220 or may transmit signals or data generated by the controller 220 to the host device 100.

In an example, the communicator 230 may receive compressed and merged print data from the host device 100.

The memory 240 is a space in which data such as programs for the controller 220 to perform calculations is stored. Various types of data such as programs and files, such as applications, may be installed and stored in the memory 240.

In an example, the memory 240 may store data received from the host device 100.

The image forming job unit 250 may perform an image forming job such as printing, scanning, or faxing.

Referring to FIG. 2, the image forming job unit 250 is shown as including a printer 251, a scanner 252, and a fax unit 253. The image forming job unit 250 may include only some of these components or may further include a configuration for performing other kinds of image forming jobs.

The printer 251 may form an image on a recording medium by various printing methods such as an electrophotographic method, an inkjet method, a thermal transfer method, and a direct thermal method.

The scanner 252 may irradiate light to a document, receive the reflected light, and read an image recorded on the document. For example, a charge-coupled device (CCD) or a contact type image sensor (CIS) may be employed as an image sensor for reading the image from the document. The scanner 252 may have a flatbed structure in which the document is positioned at a fixed position and the image sensor is moved while reading the image, a document feed structure in which the image sensor is positioned at a fixed position, and the document is conveyed, and a composite structure thereof.

In the case of the fax unit 253, a configuration for scanning an image may be shared with the scanner 252, a configuration for printing the received file may be shared with the printer 251, and may transmit a scanned file to a destination or receive a file from the outside.

FIG. 3 is a flowchart of a method by which a host device encodes print data, according to an example of the present disclosure.

Referring to FIG. 3, in operation S310, the host device may receive a print request for a compound document. For example, the host device may receive a print request for each object with respect to a compound document that includes a text object, a graphics object, and a raster object.

In operation S320, the host device may classify the objects included in the compound document into predetermined groups based on object attribute information.

The object attribute information is information indicating at least one attribute corresponding to an object. For example, the object attribute information may include, but is not limited to, the number of colors used in the object, a gradient value of the object, an enlargement print ratio of the object, and the like.

The host device may obtain the object attribute information from the print data. For example, the host device may interpret the print data to determine attributes of objects constituting the print data, and obtain the object attribute information according to a determination result.

The host device may classify the objects included in the compound document into predetermined groups according to the obtained attribute information of the object so that an appropriate compression method is applied to each object.

In operation S330, the host device may compress a group of the classified predetermined groups according to a predetermined compression method to be applied to the group. For example, the host device may compress at least one group of the predetermined groups using a lossless compression method and compress another group using a loss compression method.

The lossless compression method may be defined as a compression method in which data before compression and data after decompression are the same. The lossless compression method has a low compression ratio and may be mainly used when it is important to improve accuracy of data rather than a compression ratio. For example, a DELTAROW method may be a lossless compression method of image data.

The loss compression method may be defined as a compression method in which data before compression and data after decompression are not the same. The loss compression method has a high compression ratio and may be mainly used when it is important to increase a compression ratio more than accuracy. For example, a JPEG method may be a loss compression method of image data.

The loss compression method may be divided into a first loss compression method including a YCC conversion operation and a second loss compression method that does not include the YCC conversion operation according to whether the YCC conversion operation exists.

In operation S340, the host device may merge the compressed data and transmit the merged data to a printer.

FIG. 4 is a flowchart of a method by which a host device encodes a printing command according to an example of the present disclosure.

Referring to FIG. 4, in operation S410, the host device may receive a printing command for a compound document.

In an example, the printing command may include a command corresponding to each of a plurality of objects contained in the compound document. For example, the printing command may include a text command corresponding to a text object, a graphics command corresponding to a graphics object, and a raster command corresponding to a raster object.

In an example, the host device may receive a text command, a graphics command, and a raster command for a compound document that includes a text object, a graphics object, and a raster object.

In operation S420, the host device may determine whether the received printing command is a text command or a graphics command.

In operation S440, when the received printing command is the text command or the graphics command, the host device may compress the received printing command using a lossless compression method.

In operation S430, if the received printing command is a raster command, the host device may classify the raster command into a predetermined group based on object attribute information of a raster object.

For example, the host device may classify a raster command corresponding to a raster object according to the number of colors used in the raster object, a gradient value of the raster object, an enlargement print ratio of the raster object, or an area ratio of the raster object and a background object.

An operation in which the host device classifies raster commands is described in detail with reference to FIG. 5.

In operations S440 to S460, the host device may compress each of the classified predetermined groups according to a predetermined compression method.

In an example, the host device may compress text commands or graphics commands using a lossless compression method.

Further, the host device may compress the raster commands using a lossless compression method, a first loss compression method, and a second loss compression method according to the classified groups.

For example, the first loss compression method may be a loss compression method such as JPEG compression. The second loss compression method may be a loss compression method that does not perform YCC conversion among loss compression methods.

FIG. 5 is a flowchart of a method by which a host device classifies raster commands according to an object tag according to an example of the present disclosure.

In operation S510, the host device may receive a printing command for a compound document.

In an example, the host device may receive text commands, graphics commands, and raster commands for a compound document that includes text objects, graphics objects, and raster objects.

In operation S520, the host device may convert print data into bitmap image data. For example, when a print request is received, the host device may convert the print data into an image in a bitmap format to generate bitmap image data.

The image in the bitmap format is a set of pixels that is the smallest unit with a single color value. For example, the image in the bitmap format may have one color value of 3 bytes for each pixel, and a set of color values for each pixel may be bitmap image data.

In operation S530, the host device may add an object tag corresponding to the printing command to the converted bitmap image data.

The object tag may be defined as data of 1 byte value indicating object attribute information. The host device may extract the object attribute information in pixel units of a bitmap image so that the object attribute information may be added to the bitmap image data. For example, the host device may represent the object attribute information as a 1 byte value for a pixel of the bitmap image, and 1 byte object attribute information may be the object tag.

The host device may add the object tag to the converted bitmap image data, and the image in the bitmap format to which the object tag is added may have one color value of 4 bytes for each pixel.

In an example, the host device may add a text object tag to the bitmap image data in which the text object is converted, and may add a graphics object tag to the bitmap image data in which the graphic object is converted.

Further, the host device may add different raster object tags to the bitmap image data according to respective raster object attributes to the bitmap image data into which the raster objects are converted.

In operation S540, the host device may classify the bitmap image data into a predetermined group according to the added object tag.

In an example, the host device may classify the converted bitmap image data into a predetermined group according to the object tag so that an appropriate compression method is applied to each object.

In operation S550, the host device may compress predetermined groups according to predetermined compression methods.

For example, the host device may compress each group using any one of a lossless compression method, a first loss compression method, and a second loss compression method.

In operation S560, the host device may merge the compressed bitmap image data and convert the merged bitmap image data into a printer command format.

In operation S570, the host device may transmit the data in the printer command format to an image forming apparatus.

FIG. 6 illustrates an example in which a host device classifies raster commands according to an object tag, according to an example of the present disclosure.

Referring to FIG. 6, a compound document 600 may include objects such as a background object 601, a text object 602, graphic objects 603 to 604, raster objects 605 to 607, and the like.

The host device may receive a text command corresponding to the text object 602, graphics commands corresponding to the graphic objects 603 to 604, and raster commands corresponding to the raster objects 605 to 607.

The host device may represent each piece of object attribute information in an object tag. For example, the host device may represent the object attribute information as a 1 byte value for a pixel of a bitmap image.

The object tag corresponding to each object will be described with reference to an object tag table 610.

For example, an object tag for the background object 601 may be "0xFF". An object tag for the text object 602 may be "0xFC". Object tags for the graphic objects 603 to 604 may be "0xFD". Object tags for the raster objects 605 to 607 may respectively be "0xFE", "0x00", and "0x01". However, the object tag is not limited to the above-described value, and may be various values.

The object tag may be added to the bitmap image data in a rendering process of converting print data into bitmap image data. An image in a bitmap format to which the object tag is added may have one color value of 4 bytes for each pixel.

A bitmap image data classification according to the object tag will be described with reference to a bitmap image data classification table 620.

The host device may classify the bitmap image data into a predetermined group according to the object tag. For example, the host device may use the object tag to determine which compression method should be applied to the bitmap image data.

The host device may classify the bitmap image data into a lossless compressed group if the bitmap image data includes the object tag of "0xFC", "0xFD", "0xFE", or "0xFF". In addition, if the bitmap image data includes the object tag of "0x00", the host device may classify the bitmap image data into a first loss compression group. Further, if the bitmap image data includes the object tag of "0x01", the host device may classify the bitmap image data into a second loss compression group.

FIG. 7 illustrates an example in which a host device classifies raster objects based on object attribute information according to an example of the present disclosure.

Referring to FIG. 7, a compound document 700 may include objects such as a background object 701, a text object 702, graphic objects 703 and 704, raster objects 705 to 707, and the like.

In predetermined groups 710 to 730 shown in FIG. 7, objects corresponding to object commands are shown instead of object commands. For example, the objects 701 to 705 shown in a lossless compression group 710 respectively represent corresponding object commands.

The host device may classify the object commands corresponding to the objects into predetermined groups 710 to 730 based on object attributes. The host device may determine an appropriate compression method for each object command by taking into account the object attribute. For example, the host device may classify the object commands into a lossless compression group 710, a first loss compression group 720, and a second loss compression group 730 according to determined compression methods.

In an example, the host device may classify object commands respectively corresponding to objects with a small number of used colors into the lossless compressed group 710. For example, a background command, a text command, and a graphics command may be classified into the lossless compression group 710.

The host device may classify a raster command into a predetermined group according to the number of colors used in a raster object, a degree of color change in the object, an enlargement printing ratio of the object, an area ratio between the raster object and a background object, and the like.

The host device may classify the raster command according to the number of colors used in the raster object. For example, if the number of colors used in the raster object is less than a threshold, the host device may classify the raster command into the lossless compressed group 710. If the number of colors used in the raster object is greater than or equal to the threshold, the host device may classify the raster command into the loss compression groups 720 or 730.

For example, the host device may classify the corresponding raster command into the lossless compression group 710 if a raster object 705 is made of only lines and graphics. Further, when the raster object 706 is composed of a plurality of colors, the corresponding raster command may be classified into the first loss compression group 720.

The host device may classify the raster command according to the gradient value of the raster object.

The gradient value may be defined as a value indicating a degree of change in color contained in the object. The gradient value in the object is a difference value of color values of two adjacent pixels. The gradient values are smaller as the colors of adjacent pixels are similar, and the gradient values are larger as the colors of adjacent pixels are different.

For example, if the gradient value of the raster object is greater than a threshold, the host device may classify the raster command into the first loss compression group 720. Alternatively, if the gradient value is less than the threshold, the host device may classify the raster command into the second loss compression group 730 that does not perform YCC conversion.

For example, the host device may classify the corresponding raster command into the second loss compression group 730 if a raster object 707 has a gradient value of 16 or less.

The host device may classify the raster command according to the enlargement printing ratio of the raster object. For example, the host device may classify the raster command into the lossless compressed group 710 if the enlargement printing ratio of the raster object is greater than or equal to a threshold. Alternatively, the host device may classify the raster command into the loss compression groups 720 through 730 if the enlargement printing ratio of the raster object is less than the threshold.

The host device may classify the raster command according to the area ratio of the raster object and the background object. For example, the host device may classify the raster command by calculating an area drawn by the raster object in the background object. If the area ratio of the raster object to the background object is equal to or greater than a threshold, the host device may classify the raster command into the loss compression groups 720 to 730. Alternatively, the host device may classify the raster command into the lossless compressed group 710 if the area ratio of the raster object to the background object is less than the threshold.

FIG. 8 is a diagram illustrating an example in which a host device converts bitmap image data 810 into index color data according to an example of the present disclosure.

The host device may convert print data into the bitmap image data 810. For example, when a print request is received, the host device may convert the print data into an image in bitmap format to generate the bitmap image data 810.

Referring to FIG. 8, the host device may convert the converted bitmap image data 810 into index color data 8 based on the number of colors included in the bitmap image data. The index color data is data that represents bitmap image data by an index number indicating a color value.

The host device may calculate the number of colors used in the bitmap image data 810 to determine the index color. An operation in which the host device determines the index color will be described with reference to an index color table 800 as an example.

For example, the host device may determine a color having a value of "(253, 0, 0, 0)" as an index color having a value of "0", a color having a value of "(255, 255, 255, 255)" as an index color having a value of "1", a color having a value of "(254, 51, 255, 255)" as an index color having a value of "2", and a color having a value of "(254, 255, 0, 0)" as an index color having a value of "3".

The host device may convert pixel values by applying the index color values of "0" through "3" to the bitmap image data 810.

For example, the host device may covert the pixel value from "(253, 0, 0, 0)" to "0", from "(255, 255, 255, 255)" to "1", from "(254, 51, 255, 255)" to "2" and from "(254, 255, 0, 0)" to "3".

The host device may merge values of four adjacent pixels having values of "0" through "3" to convert the merged value into a 2 byte hexadecimal value.

For example, when four consecutive pixel values are "1, 1, 1, 1", the host device may express the 4 pixel values in 2 bits and merge the 4 pixel values as a value of 2 byte "01010101". The host device may express a value of 2 byte "01010101" in a value of 2 byte "0x55".

In addition, when the four consecutive pixel values are "0, 1, 1, 1", the host device may represent 4 pixel values as bits and merge the 4 pixel values as a value of 2 byte "00010101". The host device may express a value of 2 byte "00010101" as a value of 2 byte "0x15".

The host device may reduce a data size by converting the color value used for the bitmap image data into an index number. For example, the host device may convert the 224 byte bitmap image data 810 into 28 byte index color data 830 using the index color.

The host device may compress the generated index color data. In an example, the host device may compress the generated index color data using a lossless compression method.

According to the present disclosure, a host device may reduce the size of data transmitted to a printer through a network, increase a document output speed, and reduce the load of a printer memory. Also, a compression method may be determined according to a gradient value including the print data, thereby preventing a print quality loss.

Meanwhile, the above-described examples may be embodied in form of a computer-readable recording medium storing computer-executable instructions and data. At least one of the command and data may be stored in the form of program code, and when executed by the processor, a predetermined program module may be generated to perform a predetermined operation.

The computer-readable recording medium may be, for example, a magnetic storage medium such as a hard disk, an optical reading medium such as a CD and a DVD, or the like, and may be a memory included in a server accessible through a network. For example, the computer-readable recording medium may be at least one of the memory 140 of the host device 100 and a memory of the inputter/outputter 110, or the memory 240 included in the image forming apparatus 200 through the host device 100 and a network.

While one or more examples have been described with reference to the figures, it will be understood by those of ordinary skill in the art that various changes in form and details may be made therein without departing from the spirit and scope as defined by the following claims.

The invention claimed is:

1. A method of encoding print data performed by a host device, the method comprising:
   receiving a print request for a compound document;
   converting print data of the compound document into bitmap image data;
   adding an object tag indicating object attribute information to the bitmap image data;
   classifying objects included in the compound document into groups based on the object tag;
   compressing each group among the groups according to a set compression method corresponding to the respective group; and
   merging the compressed groups and transmitting the merged groups to an image forming apparatus,
   wherein the bitmap image data comprises four bytes for each pixel including one color value of three bytes for each pixel of the compound document and
   the object tag of one byte to indicate the object attribute information for each pixel.

2. The method of claim 1, wherein the compressing of the group among the groups according to the set compression method comprises:
   compressing the group among the groups using a loss compression method as the set compression method without performing YCC conversion on the group.

3. The method of claim 1, wherein the compressing of the group among the groups according to the set compression method comprises:
   converting bitmap image data included in the group among the groups into index color data based on a number of colors included in the bitmap image data; and
   compressing the index color data.

4. The method of claim 1, wherein the set compression method corresponding to the group is determined based on the object tag indicating the object attribute information.

5. The method of claim 1, wherein the classifying of the objects included in the compound document into the groups based on the object tag comprises:
   receiving printing commands corresponding to the objects for the compound document; and
   classifying the received printing commands corresponding to the objects into the groups based on the object tag indicating the object attribute information.

6. The method of claim 5, wherein the classifying of the printing commands into the groups based on the object tag indicating the object attribute information comprises:
   classifying a raster command, among the printing commands, corresponding to a raster object among the objects into the groups based on the object tag indicating the object attribute information.

7. A host device comprising:
   an inputter/outputter to receive a print request;
   a communicator to transmit data to an image forming apparatus; and
   a controller to:
      receive the print request for a compound document through the inputter/outputter,
      convert print data of the compound document into bitmap image data,
      add an object tag indicating object attribute information to the bitmap image data,
      classify objects included in the compound document into groups based on the object tag,
      compress each group among the groups according to a set compression method corresponding to the group, and
      merge the compressed groups and transmit the merged groups to an image forming apparatus through the communicator,
   wherein the bitmap image data comprises four bytes for each pixel including one color value of three bytes for each pixel of the compound document and
   the object tag of one byte to indicate the object attribute information for each pixel.

8. The host device of claim 7, wherein the controller is to compress the group among the groups using a loss compression method as the set compression method without performing YCC conversion on the group.

9. The host device of claim 7, wherein the controller is to convert bitmap image data included in at least one group among the groups into index color data based on a number of colors included in the bitmap image data and compresses the index color data.

10. The host device of claim 7, wherein the controller is to:
    receive printing commands corresponding to the objects for the compound document, and
    classify the received printing commands corresponding to the objects into the groups based on the object tag indicating the object attribute information.

11. The host device of claim 10, wherein the controller is to classify a raster command, among the printing commands, corresponding to a raster object among the objects into the groups based on the object tag indicating the object attribute information.

12. The host device of claim 11, wherein the controller is to classify the raster command according to a number of colors used in the raster objects.

13. The host device of claim 11, wherein the controller is to classify the raster command according to gradient values of the raster objects.

14. The host device of claim 11, wherein the controller is to classify the raster command according to an enlargement print ratio of the raster objects.

15. The host device of claim 11, wherein the controller is to classify the raster command according to an area ratio between the raster objects and a background object configuring the print data.

16. A non-transitory computer readable recording medium storing a program for executing a method of encoding print data performed by a host device on a computer, the method comprising:

receiving a print request for a compound document;

converting print data of the compound document into bitmap image data;

adding an object tag indicating object attribute information to the bitmap image data;

classifying objects included in the compound document into groups based on the object tag;

compressing each group among the groups according to a set compression method corresponding to the respective group; and merging the compressed groups and transmitting the merged groups to an image forming apparatus, wherein the bitmap image data comprises four bytes for each pixel including one color value of three bytes for each pixel of the compound document and the object tag of one byte to indicate the object attribute information for each pixel.

* * * * *